(12) United States Patent
Kudo

(10) Patent No.: US 11,830,894 B2
(45) Date of Patent: Nov. 28, 2023

(54) CMOS IMAGE SENSOR PIXEL FOR HIGH DYNAMIC RANGE CAPTURING

(71) Applicant: OmniVision Technologies, Inc., Santa Clara, CA (US)

(72) Inventor: Yoshiharu Kudo, Kanagawa (JP)

(73) Assignee: OmniVision Technologies, Inc., Santa Clara, CA (US)

( * ) Notice: Subject to any disclaimer, the term of this patent is extended or adjusted under 35 U.S.C. 154(b) by 14 days.

(21) Appl. No.: 17/562,870

(22) Filed: Dec. 27, 2021

(65) Prior Publication Data

US 2023/0207584 A1 Jun. 29, 2023

(51) Int. Cl.
*H01L 27/146* (2006.01)
*H04N 25/59* (2023.01)
*H04N 25/75* (2023.01)

(52) U.S. Cl.
CPC .. *H01L 27/14612* (2013.01); *H01L 27/14603* (2013.01); *H01L 27/14656* (2013.01); *H04N 25/59* (2023.01); *H04N 25/75* (2023.01)

(58) Field of Classification Search
CPC .. H04N 25/59; H04N 25/75; H01L 27/14612; H01L 27/14603; H01L 27/14656
See application file for complete search history.

(56) References Cited

U.S. PATENT DOCUMENTS

| | | | | |
|---|---|---|---|---|
| 10,313,613 | B2* | 6/2019 | Velichko | H01L 27/14609 |
| 10,536,652 | B2* | 1/2020 | Oh | H01L 27/14641 |
| 11,736,833 | B1* | 8/2023 | Choi | H04N 25/622 |
| | | | | 348/308 |
| 2021/0029312 | A1* | 1/2021 | Geurts | H04N 25/616 |

* cited by examiner

*Primary Examiner* — Lin Ye
*Assistant Examiner* — John H Morehead, III

(57) ABSTRACT

An image sensor element includes a transfer transistor TX, a LOFIC select transistor LF, a photodiode PD, and a first overflow path OFP. The transfer transistor TX outputs a readout signal from a first end. The LOFIC select transistor LF includes a first end connected to a second end of the transfer transistor TX, and a second end connected to a capacitor. The photodiode PD is connected in common to a third end of the transfer transistor and a third end of the LOFIC select transistor LF. The first overflow path OFP is formed between the photodiode PD and a second end of the LOFIC select transistor LF. Each of the transfer transistor TX and the LOFIC select transistor LF is configured with a vertical gate transistor.

10 Claims, 12 Drawing Sheets

CMOS IMAGE SENSOR PIXEL FOR HIGH DYNAMIC RANGE CAPTURING

TECHNICAL FIELD

The present disclosure relates to an image sensor element using a CMOS pixel including a LOFIC.

BACKGROUND

CMOS image sensors (CIS) have been widely used as imaging elements and wide varieties of CIS with various functions are available.

As CIS cannot generally store a large amount of signal charge in a photodiode, the dynamic range is not sufficient, easily causing image saturation and flickering of LED. Multi-exposures are therefore often performed to obtain a high dynamic range (HDR) image. However, the multi-exposures have issues of time lag between images obtained at different exposures.

Some methods have been proposed to increase the amount of signal charge in CIS. For example, Patent Literature 1 (US 2008/0237446 A1) uses lateral overflow integration capacitor (LOFIC) pixels. Because the LOFIC pixels can process a large amount of signal charge, LOFIC pixels are tolerant against the saturation of charge under high illumination conditions. However, as LOFIC pixels cannot share a component between pixels, downsizing of each LOFIC pixel is difficult.

Non-patent Literature 1 (Sakai et al., "ITE Technical Report", Vol. 34, No. 16, pp. 59-62) suggests a source follower shared pixel as an improved version of the LOFIC pixel. In this suggestion, as components, such as a source follower transistor and a capacitor, can be shared by two pixels, the downsizing of the pixel appears to be possible.

However, the source follower shared LOFIC pixel requires a LOFIC overflow transistor and a LOFIC select transistor in addition to the components of a conventional pixel. In other words, while some components can be shared, some additional components are required. Accordingly, a desired pixel downsizing cannot be achieved by this improvement alone.

SUMMARY

An image sensor element according to an aspect of the present disclosure includes a transfer transistor, a LOFIC select transistor, a photodiode, and a first overflow path. The transfer transistor outputs a readout signal from a first end. The LOFIC select transistor includes a first end connected to a second end of the transfer transistor, and a second end connected to a capacitor. The photodiode is connected in common to a third end of the transfer transistor and a third end of the LOFIC select transistor. The first overflow path is formed between the photodiode and a second end of the LOFIC select transistor. Each of the transfer transistor and the LOFIC select transistor is configured with a vertical gate transistor. Each vertical gate transistor includes a gate, and first to third ends. The gate extends vertically. The first and second ends are disposed around the gate in a horizontal periphery. The third end is disposed under the gate. Connections between the first end, the second end, and the third end are turned ON and OFF by controlling a voltage supplied to the gate.

The transfer transistor and the LOFIC select transistor may be disposed next to each other in a well, and the photodiode may be disposed under the well.

The first end of the transfer transistor may be connected to a floating diffusion that electrically floats, and the floating diffusion may be connected to a gate of an output transistor.

A second overflow path may be disposed between the second end of the LOFIC select transistor and the first end of the transfer transistor.

An image sensor may include multiple image sensor elements described above.

With the present disclosure, LOFIC pixels can be downsized.

BRIEF DESCRIPTION OF DRAWINGS

Embodiments of the present disclosure will be described based on the following figures, wherein.

DESCRIPTION OF EMBODIMENTS

Embodiments of the present disclosure are described below with reference to the attached drawings. The present disclosure is not limited to these embodiments.

Vertical Gate Transistor

Figure 1:
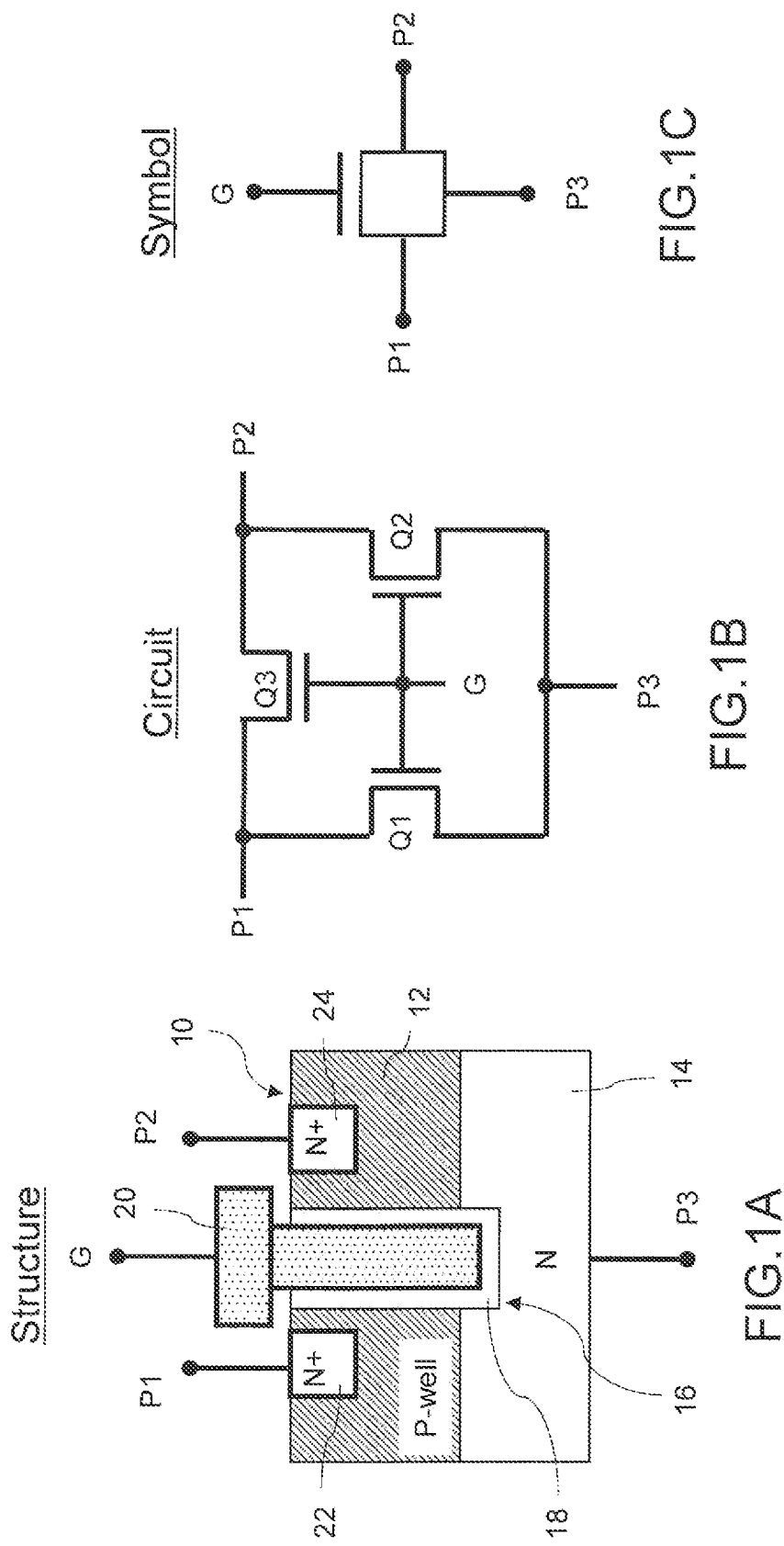
FIG. 1A is a cross sectional view showing a structure of a vertical gate (VG) transistor.
FIG. 1B is a circuit diagram of the vertical gate (VG) transistor.
FIG. 1C is a diagram showing symbols used for the vertical gate (VG) transistor.

The image sensor element according to an embodiment of the present disclosure uses vertical gate (VG) transistors described below based on FIGS. 1A to 1C.

FIG. 1A is a cross sectional view showing an example of a structure of each VG transistor. A p-well 12 doped with p-type impurities is disposed on the front side of a semiconductor substrate 10, whereas an n-well 14 doped with n-type impurities is disposed on the bottom side.

A trench 16 that is a hole extending from the front side toward the bottom side is formed in the semiconductor substrate 10. The trench 16 extends through the p-well 12 and the bottom end of the trench 16 reaches into an upper portion of the n-well 14. A gate insulation film 18 covers the inner circumferential surface of the trench 16. A gate 20 made of a conductive material is disposed inside the trench 16. Two conductive regions 22, 24 doped with n-type impurities are disposed in the p-well 12 around the trench 16. The conductive region 22 is a first end P1 (drain); the conductive region 24 is a second end P2 (drain); an n-well 14 is a third end P3 (source); and an end of the gate 20 is externally connected as a terminal G.

The semiconductor substrate 10 may be a silicon (Si) substrate, and the gate insulation film 18 may be made of oxide silicon. The gate 20 may be made of a well-known material, such as polysilicon. The impurities may also be well-known materials.

In such a VG transistor, when positive voltage is applied to the gate 20, channels are formed in the p-well around the gate 20 in vertical and horizontal directions, making conductive paths between the first, second, and third ends.

FIG. 1B is a circuit diagram corresponding to FIG. 1A. As shown in FIG. 1B, gates of three transistors Q1 to Q3 are connected to the terminal G. Terminals (source or drain) of the transistors Q1 to Q3 are sequentially connected such that the connections between Q1 and Q3, Q3 and Q2, and Q2 and Q1 become the first to third ends P1 to P3, respectively.

The three transistors Q1 to Q3 are thus turned ON or OFF at the same time in accordance with an input voltage to the gate G. Connections between the first end P1 and the second end P2, between the second end P2 and the third end P3, and between the third end P3 to the first end P1 are turned ON and OFF at the same time, accordingly.

FIG. 1C shows symbols used for the VG transistor of the above configuration according to the present embodiment. The symbols are referred to below when describing the circuit.

Pixel Configuration Overview

<Circuit Configuration>

Figure 2:
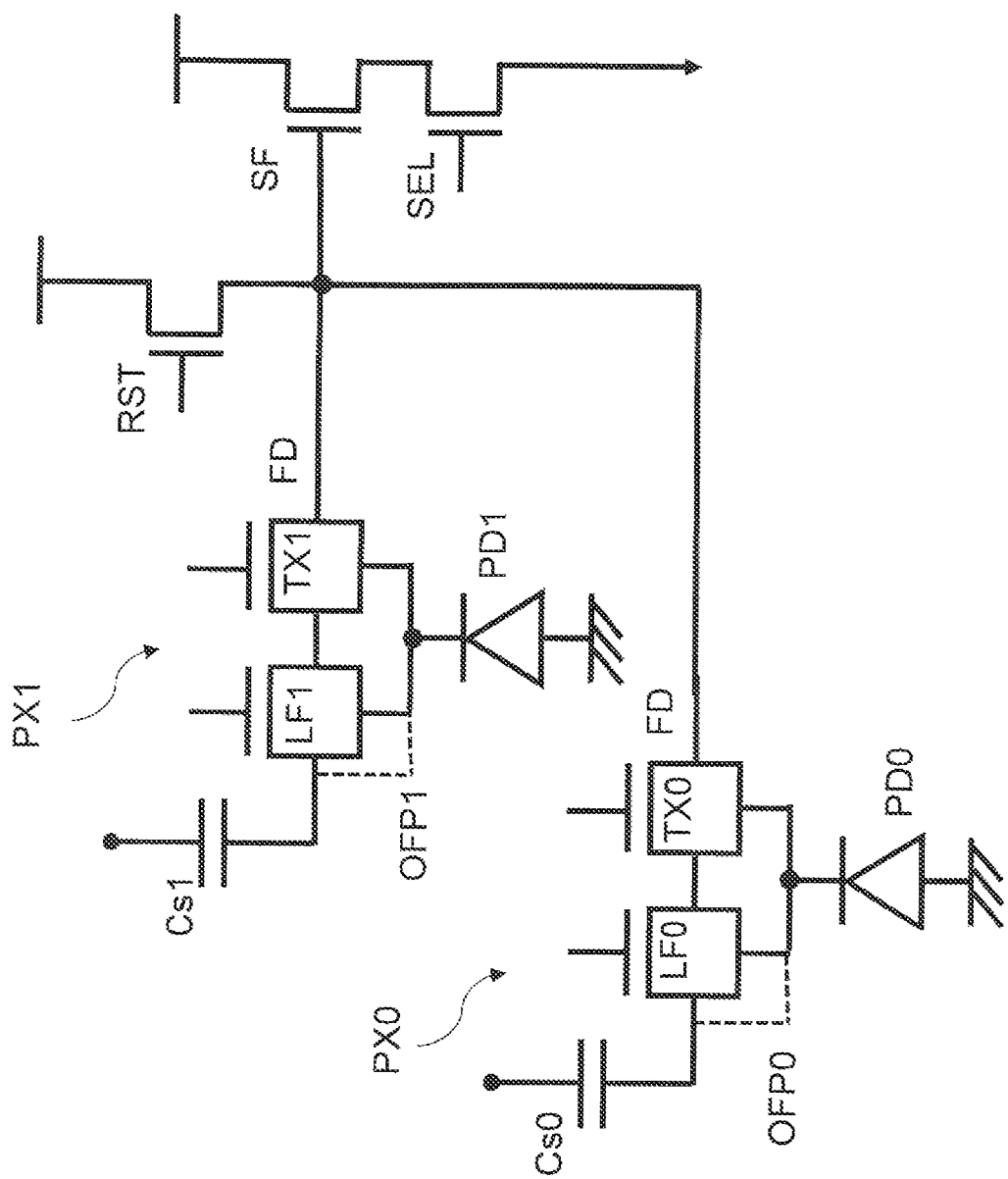
FIG. 2 is a circuit diagram of an image sensor element according to an embodiment of the present disclosure.

FIG. 2 is a circuit diagram of the image sensor element according to the present embodiment, showing a circuit for two pixels PX0 and PX1.

Although the configuration of the pixel PX0 is described below, the pixel PX1 has the same configuration. Please note that suffix "0" indicates components in the pixel PX0, whereas suffix "1" indicates components in the pixel PX1. No suffix indicates components common to both pixels.

A first end of the transfer transistor TX0 is connected to a floating diffusion FD that is electrically isolated. A second end of the transfer transistor TX0 is connected to a first end of the LOFIC select transistor LF0. A second end of the LOFIC select transistor LF0 is connected to one of the two ends of a capacitor Cs0. This portion serves as a LOFIC node. The other end of the capacitor Cs0 is connected to a power source.

The third ends of the LOFIC select transistor LF0 and the transfer transistor TX0 are connected in common to a cathode of a photodiode PD0. An anode of the photodiode PD0 is connected to a GND or a pixel reference power source equivalent to the GND of pixel.

A first overflow path OFP0 shown in a broken line in FIG. 2 is provided between the photodiode PD0 and the second end of the LOFIC select transistor LF0.

The floating diffusion FD connected to the first end of the transfer transistor TX0 is connected to a gate of a source follower transistor SF (output transistor) for signal readout and amplification. A source of the source follower transistor SF is connected to a rated current source (not shown) via a select transistor SEL. The source of the source follower transistor SF is a signal output end. The source voltage that depends on a gate input voltage (floating diffusion FD voltage) of the source follower transistor SF is thus output as a readout signal.

The floating diffusion FD is connected to a reset power source via a reset transistor RST. When the reset transistor RST is turned ON, the floating diffusion FD is reset to a reset voltage.

<Element Structure>

Figure 3B:
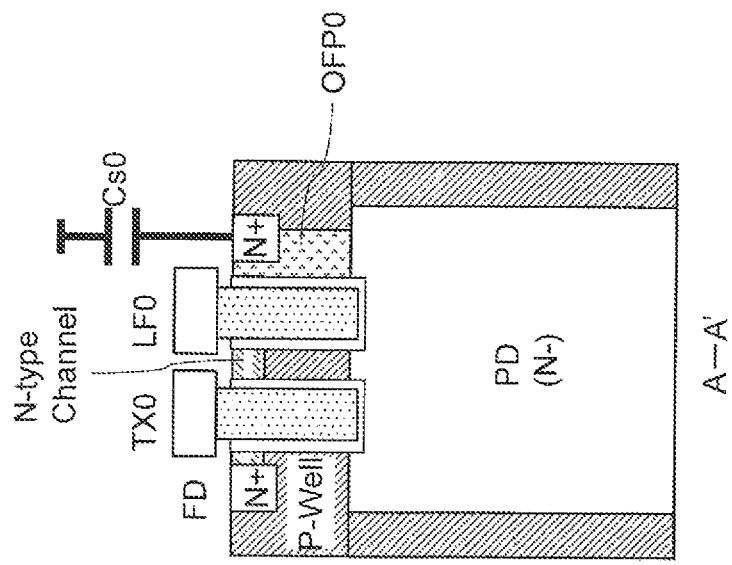
FIG. 3B is a cross section taken along line A-A' in FIG. 3A, showing a schematic structure of the image sensor element according to the embodiment of the present disclosure.
Figure 3A:
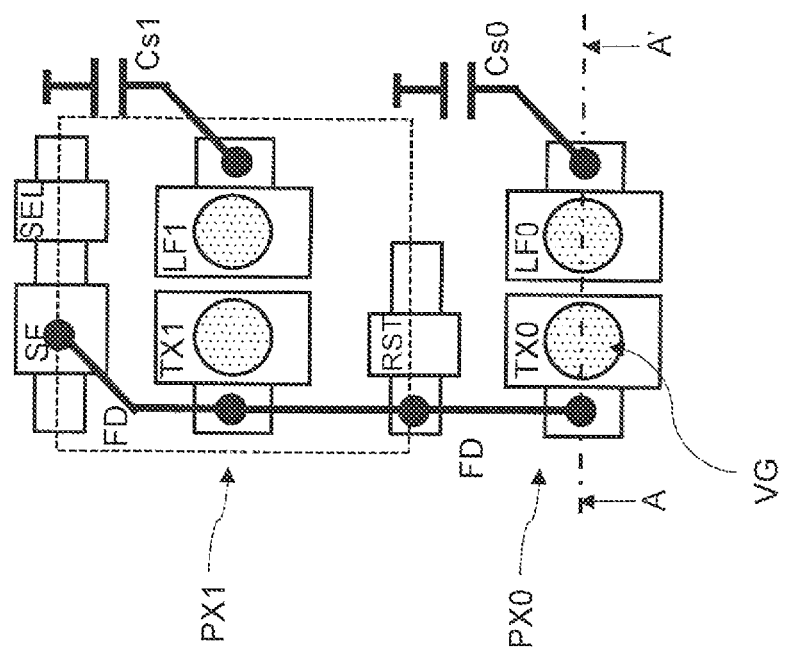
FIG. 3A is a plan view showing a schematic configuration of the image sensor element according to the embodiment of the present disclosure.

FIGS. 3A and 3B show a schematic structure of an image sensor element according to an embodiment of the present disclosure. FIG. 3A is a plan view, and FIG. 3B is a vertical cross section taken along line A-A' in FIG. 3A.

As shown in FIG. 3B, the above-described VG transistors are used for the transfer transistor TX and the LOFIC select transistor LF. The third ends of the transfer transistor TX and the LOFIC select transistor LF are disposed not in the n-well 14 as in FIG. 1, but in an n-region of the photodiode PD such that the third ends are connected to the cathode of the photodiode PD. The third ends (sources) of the transfer transistor TX and the LOFIC select transistor LF are thus connected in common to the cathode of the photodiode PD.

The first overflow path OFP0 which connects the n-region of the photodiode PD and the capacitor Cs (the LOFIC node connecting the LOFIC select transistor LF and the capacitor Cs) is vertically formed in the p-well 12. In other words, the first overflow path OFP0 extends in a vertical direction along the gate of the LOFIC select transistor LF. The first overflow path OFP0 contains impurities of a sufficient concentration, and overflowed signal charge passes there through after the saturation of signal charge generated from the photodiode PD. The signal charge from the first overflow path OFP0 is stored in the capacitor Cs.

The capacitor connected to the LOFIC node may be of any type, such as a metal-insulator-metal (MIM) or a metal-oxide-silicon (MOS) type.

N-type impurities are doped in a Si-surface channel between the LOFIC select transistor LF0 and the transfer transistor TX0, connecting the LOFIC node and the floating diffusion FD. The section between the first end P1 of the LOFIC select transistor LF0 and the second end P2 of the transfer transistor TX0 functions as a so-called deep depletion transistor. This n-type channel between P1 and P2 does not completely close even when the LOFIC select transistor LF0 and the transfer transistor TX0 are turned OFF, and functions as a second overflow path. When the signal charge stored in the capacitor Cs exceeds a certain level and overflows from the LOFIC node, the overflowed signal charge is discharged to the floating diffusion FD via the second overflow path (n-type channel) and cleared by the floating diffusion FD that is set at a reset voltage.

As shown in FIGS. 3A and 3B, the transfer transistor TX and the LOFIC select transistor LF are arranged next to each other in a horizontal direction in pixels PX0 and PX1. In FIG. 1A described above, an N+ diffusion layer is disposed at the first and second ends of the VG transistor. In the structure of the pixel according to the present embodiment, because the distance between the transfer transistor TX and the LOFIC select transistor LF is short enough, while an n-type diffusion layer is still necessary in this region, the concentration is not required to be high. By arranging the two VG transistors next to each other in the p-well, a conductive path across the two is omitted. When the transfer transistor TX and the LOFIC select transistor LF are turned ON, a channel is thus created across the two, establishing a conductive path between the LOFIC node and the floating diffusion FD.

As shown in FIG. 3A, the reset transistor RST is disposed between the pixel PX0 and the pixel PX1, and commonly used by these pixels. The first ends of the transfer transistors TX0 and TX1 are connected to the reset transistor RST via the floating diffusion FD. The floating diffusion FD is connected to the gate of the source follower transistor SF.

<Behavior>

Behavior of the circuit components is described below with reference to the timing diagram shown in FIG. 4.

Figure 4:
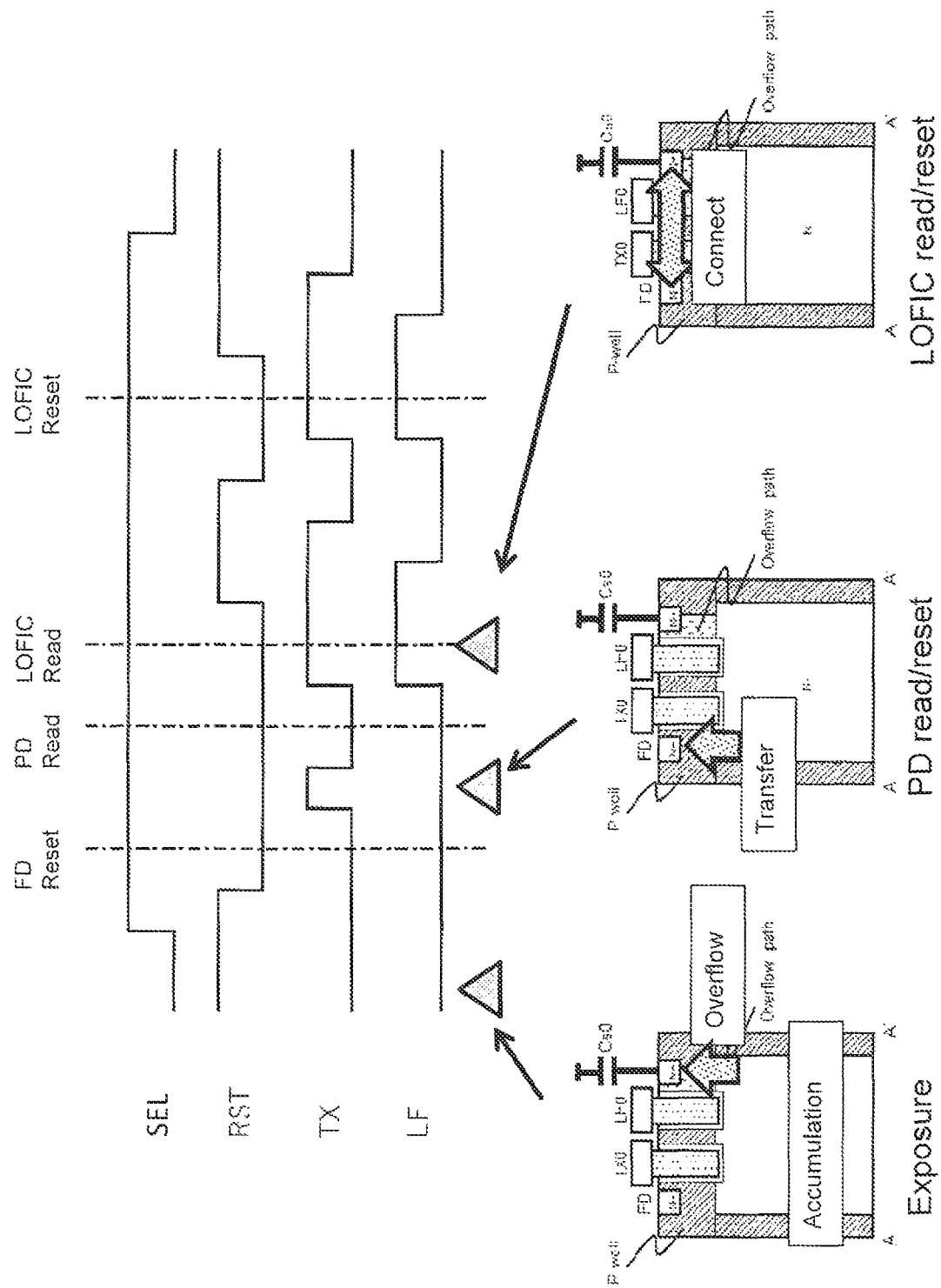
FIG. 4 is a timing diagram showing behavior of the image sensor element according to the embodiment of the present disclosure.

The timing diagram in FIG. 4 starts with an exposure process.

—Exposure

In the exposure process, the select transistor SEL is OFF; the reset transistor RST is ON; and the transfer transistor TX and the LOFIC select transistor LF are OFF. In this state, the photodiode PD stores charge corresponding to received light. When charge overflows from the photodiode PD, charge is stored in the capacitor Cs via the first overflow path OFP.

—PD Readout

The selection transistor SEL is turned ON and the reset transistor RST is turned OFF to prepare for readout. In other words, the floating diffusion FD is set to a reset voltage (voltage at the reset power source) by turning the reset transistor RST ON (FD reset).

The transfer transistor TX is turned ON to allow charge from the photodiode PD to flow to the floating diffusion FD, which is thus set at a voltage in accordance with the charge stored in the photodiode PD. Under such conditions, the transfer transistor TX is turned OFF. Because the select transistor SEL is ON, a voltage according to a current of the source follower transistor SF is output as the voltage (readout signal) corresponding to the amount of light received by the photodiode PD (PD readout).

It should be noted that the floating diffusion FD is set at the reset voltage (voltage at the reset power source) by turning the reset transistor RST ON (FD reset) before the transfer transistor TX is turned ON. When the transfer transistor is then turned ON to allow introduction of charge from the photodiode PD, the floating diffusion FD is set at a differential voltage from the reset voltage at the FD Reset. As to the PD readout, a so-called "correlated double sampling (CDS)" can be carried out by using signals at a PD Readout and a FD Reset in the timing diagram of FIG. 4.

—LOFIC Readout

Next, the transfer transistor TX and the LOFIC select transistor LF are both turned ON. As this connects the floating diffusion FD and the LOFIC node, the charge stored in the capacitor Cs is added to the charge of the floating diffusion FD set at the PD readout.

The gate of the source follower transistor SF is set to the voltage of the floating diffusion FD at this point and this voltage is read out (LOFIC readout).

—LOFIC Reset

After the LOFIC readout, with the transfer transistor TX and the LOFIC select transistor LF being ON, the reset transistor RST is turned ON, resetting the floating diffusion FD, the photodiode PD, and the LOFIC node (capacitor Cs).

After this reset, the LOFIC select transistor LF, the transfer transistor TX, the reset transistor RST are turned OFF in this order (from the transistor farthest from the source follower transistor SF).

In the above status, the settings of the transistors are the same as those at the start of the above described readout sequence (at the time of FD reset). When the transfer transistor TX and the LOFIC select transistor LF are then turned ON, the transistors are in the same status as those at the LOFIC readout without input of a charge signal from the photodiode PD. The signal in a reset state can be read out by turning the source follower transistor SF ON in this status and reading out the signal at this point (reset state readout).

The amount of signal generated by the photoelectric conversion can be measured by calculating difference between the readout signal at the reset state and the above described readout signal (LOFIC readout).

The exposure becomes possible to be started by turning the reset transistor RST ON again after reading out a signal in the above described manner, resetting the floating diffusion FD and the LOFIC node again, and turning the transfer transistor TX and the LOFIC select transistor LF OFF.

<Overflow Path>

Figure 5A:
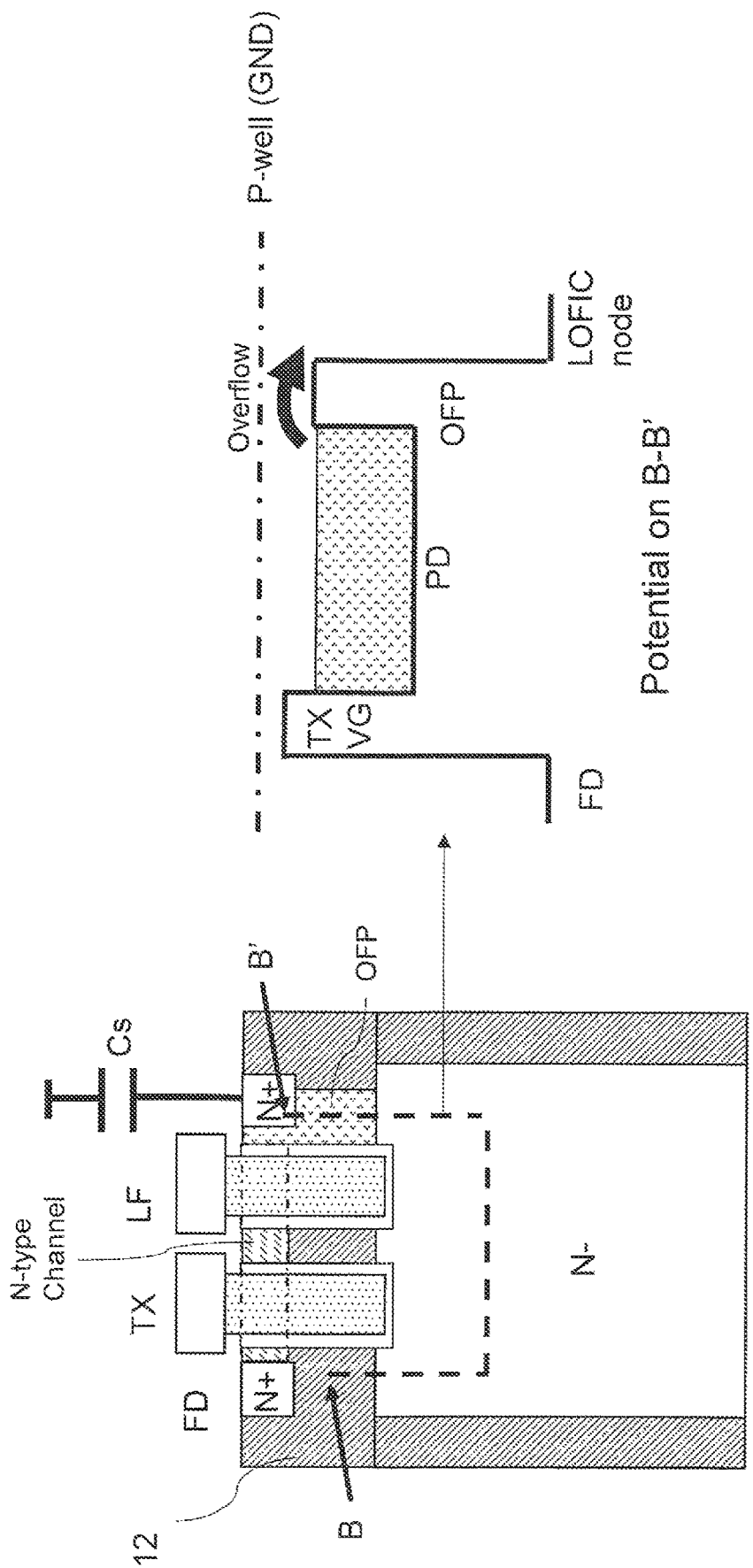
FIG. 5A is a diagram showing a charge accumulation status (potential) at a B-B' cross section of a pixel.

FIG. 5A is a cross-sectional view showing, in the right drawing, a charge storage status (potential) at the cross section taken along broken line B-B' in the left drawing. As shown in FIG. 5A, the photodiode PD stores charge in space enclosed by walls of the transfer transistor TX and the first overflow path OFP. When charge exceeds a certain amount, the charge flows into the LOFIC node via the first overflow path OFP and is stored in the capacitor Cs.

Figure 5B:
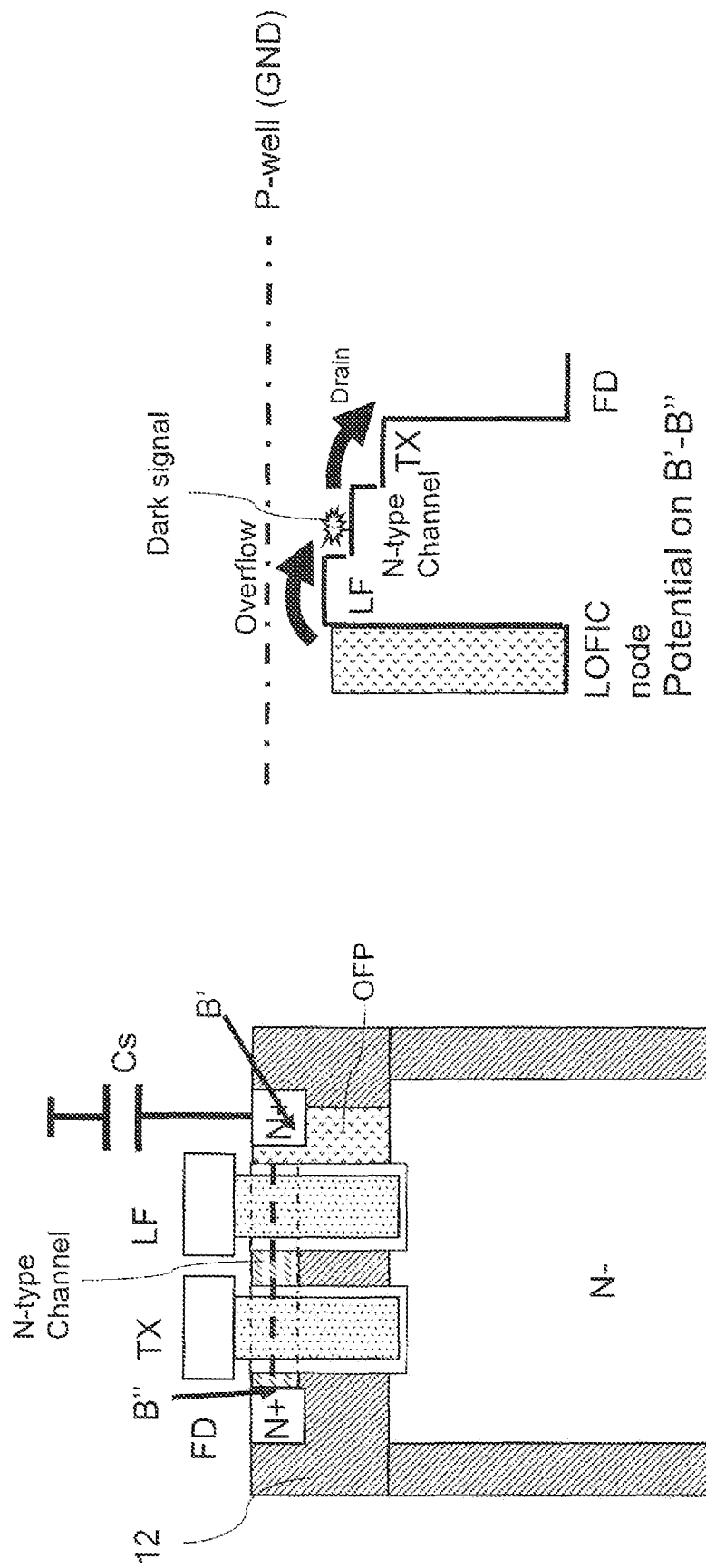
FIG. 5B is a diagram showing a charge accumulation status (potential) at a B'-B" cross section of the pixel.

FIG. 5B shows, in the right drawing, a charge storage status (potential) in the LOFIC node at the cross section taken along line B'-B" in the left drawing. As described above, n-type channel regions are formed in the Si surfaces of the transfer transistor TX and the LOFIC select transistor LF, creating a so-called deep depletion transistor. Even when the transfer transistor TX and the LOFIC select transistor LF are OFF, the channels are not completely closed but serve as overflow paths. The impurity concentration is adjusted such that the potential at each transistor becomes as shown in the cross-sectional potential drawing. As an inclination is formed for the potential of the transfer transistor TX and the LOFIC select transistor LF from the LOFIC node toward the floating diffusion FD, when the LOFIC node is saturated, charge is discharged to the floating diffusion FD. This can prevent blooming in which charge overflows into adjacent pixels over the p-well, even when the photodiode PD and the LOFIC node are saturated.

One of problems to be solved by the pixel structure of the present disclosure is the generation of dark signals between the transfer transistor TX and the LOFIC select transistor LF. Because the potential inclination of the channel discharges the generated dark signals to the floating diffusion FD, the dark signals are prevented from causing a problem in reading out signals from the photodiode PD and the LOFIC signals. It should be noted that the distance between the transfer transistor TX and the LOFIC select transistor LF may be short to prevent a potential pocket that would be otherwise likely to occur.

Figure 6A:
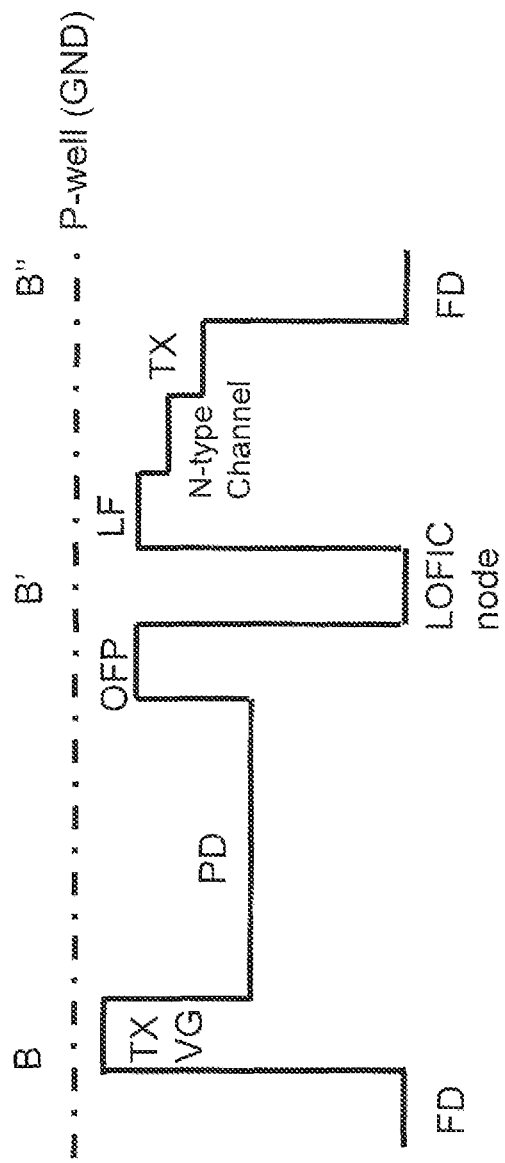
FIG. 6A is a diagram showing the potentials at the cross sections shown in FIGS. 5A and 5B (the potential diagram without signal during the exposure period)
Figure 6B:
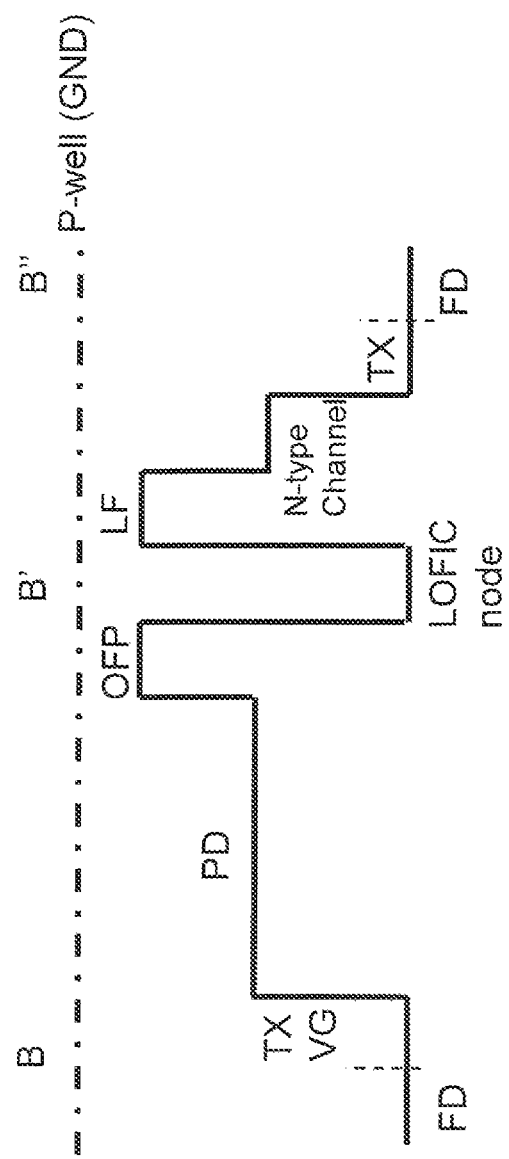
FIG. 6B is a diagram showing the potentials at the cross sections shown in FIGS. 5A and 5B (the potential diagram during PD readout)
Figure 6C:
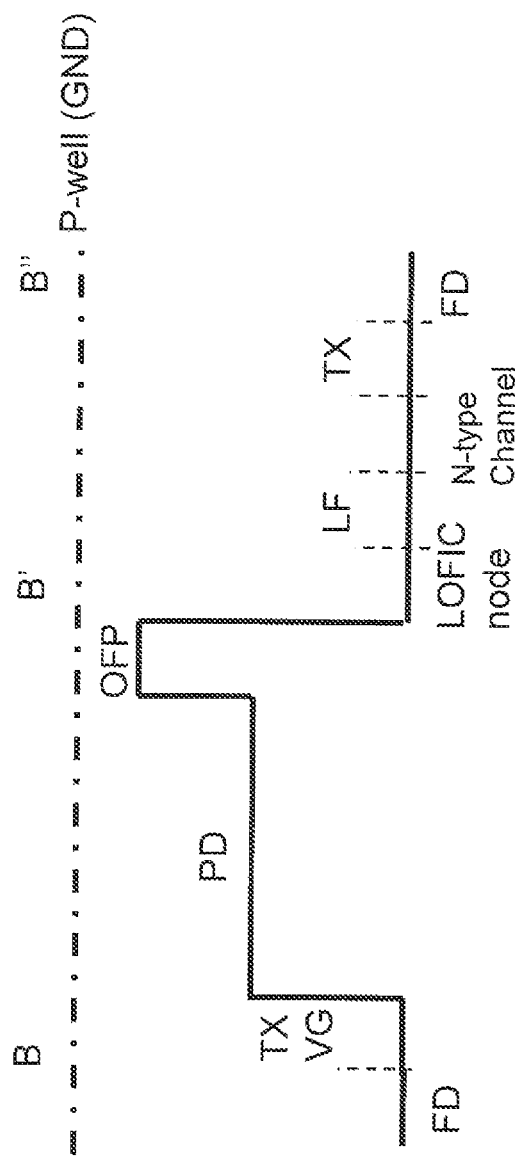
FIG. 6C is a diagram showing the potentials at the cross sections shown in FIGS. 5A and 5B (the potential diagram during LOFIC readout)

FIGS. 6A-6C show potential diagrams at the cross sections shown in FIGS. 5A and 5B. FIG. 6A shows the potential diagram without signal during the exposure period. As aforementioned using FIGS. 5A-5B, when the photodiode PD is saturated, signal charge overflows through the overflow path OFP into LOFIC node. And, even when the LOFIC node is saturated and signal charge overflows, as overflowed signal charge is discharged into the reset power source via the n-type channel region (the second overflow path), the overflowed signal charge can be prevented from flowing into adjacent pixels and causing blooming. FIG. 6B shows the potential diagram during PD readout. The transfer transistor TX is turned ON, so the signal charge in the photodiode PD is transferred into FD. At this time, LOFIC select transistor LF is OFF, so the LOFIC signal charge is kept in the LOFIC node. FIG. 6C shows the potential diagram during LOFIC readout. The transfer transistor TX and the LOFIC select transistor LF are turned ON, so FD and LOFIC node are connected each other through those transistors.

Characteristics of Present Embodiment

As described above, in the present embodiment, the transfer transistor TX and the LOFIC select transistor LF are VG transistors which are disposed next to each other. When the transfer transistor TX and the LOFIC select transistor LF are both turned ON, the floating diffusion FD is connected to the LOFIC node of the LOFIC select transistor to which the capacitor Cs is connected. This can omit a transistor which would be otherwise required to control the connection between the LOFIC node and the floating diffusion FD. One transistor can thus be reduced from the circuit of Non-patent Literature 1 (Sakai et al., "ITE Technical Report", Vol. 34, No. 16, pp. 59-62). As the number of the transistors connected to the floating diffusion FD is reduced, the conversion gain can be increased. By arranging the VG transistors next to each other, a structure with an efficient arrangement can be achieved, reducing the size of a pixel while maintaining a LOFIC architecture.

Other Embodiments

Although each of the transfer transistor TX and the LOFIC select transistor LF includes a single VG transistor in the above embodiments, each of the transfer transistor TX and the LOFIC select transistor LF may include multiple VG transistors.

Figure 8:
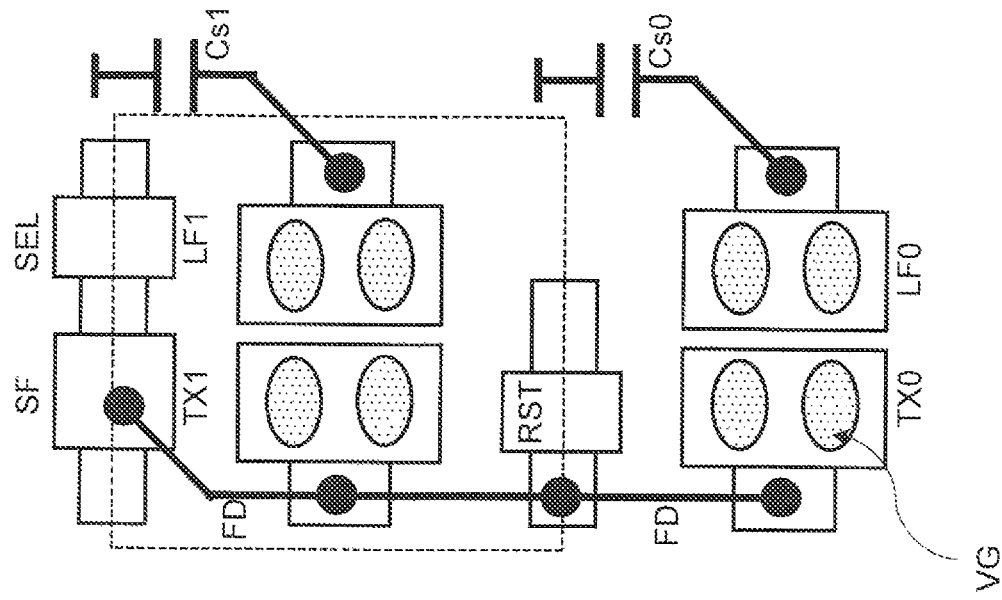
FIG. 8 is a diagram of an example with multiple VG transistors, each of which has an oval cross section.
Figure 7:
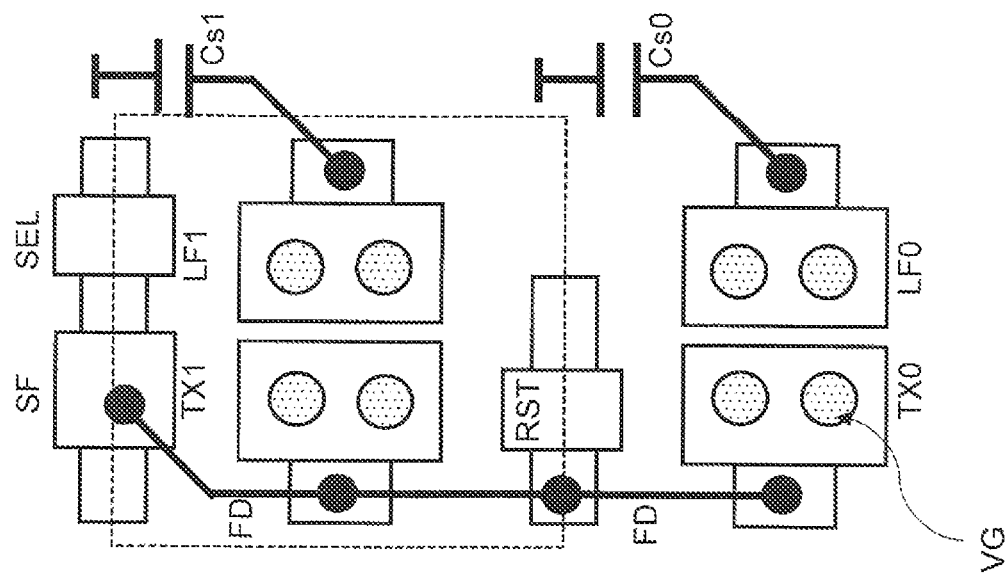
FIG. 7 is a diagram of an example of a configuration with transfer transistors TX and LOFIC select transistors LF, each of which includes multiple VG transistors (two in the example)

FIG. 7 is a plan view in which each of the transfer transistor TX and the LOFIC select transistor LF includes two VG transistors. As shown in FIG. 8, the VG transistor may have a cross section with vertical and horizontal axes of different lengths, such as an oval shape.

An advantage of providing multiple VG transistors is that a potential modulation degree between the VG transistors can be increased. As the VG transistor having an oval cross section as shown in FIG. 8 can have a larger surface area facing the opposing VG transistor than the VG transistor having a circle cross section shown in FIG. 7, the potential modulation degree is likely to be higher with the oval VG transistor. A higher potential modulation degree means a higher ON/OFF performance of the transistor, achieving an advantage of easier readout of signals (PD signals) from the photodiode PD.

Figure 9:
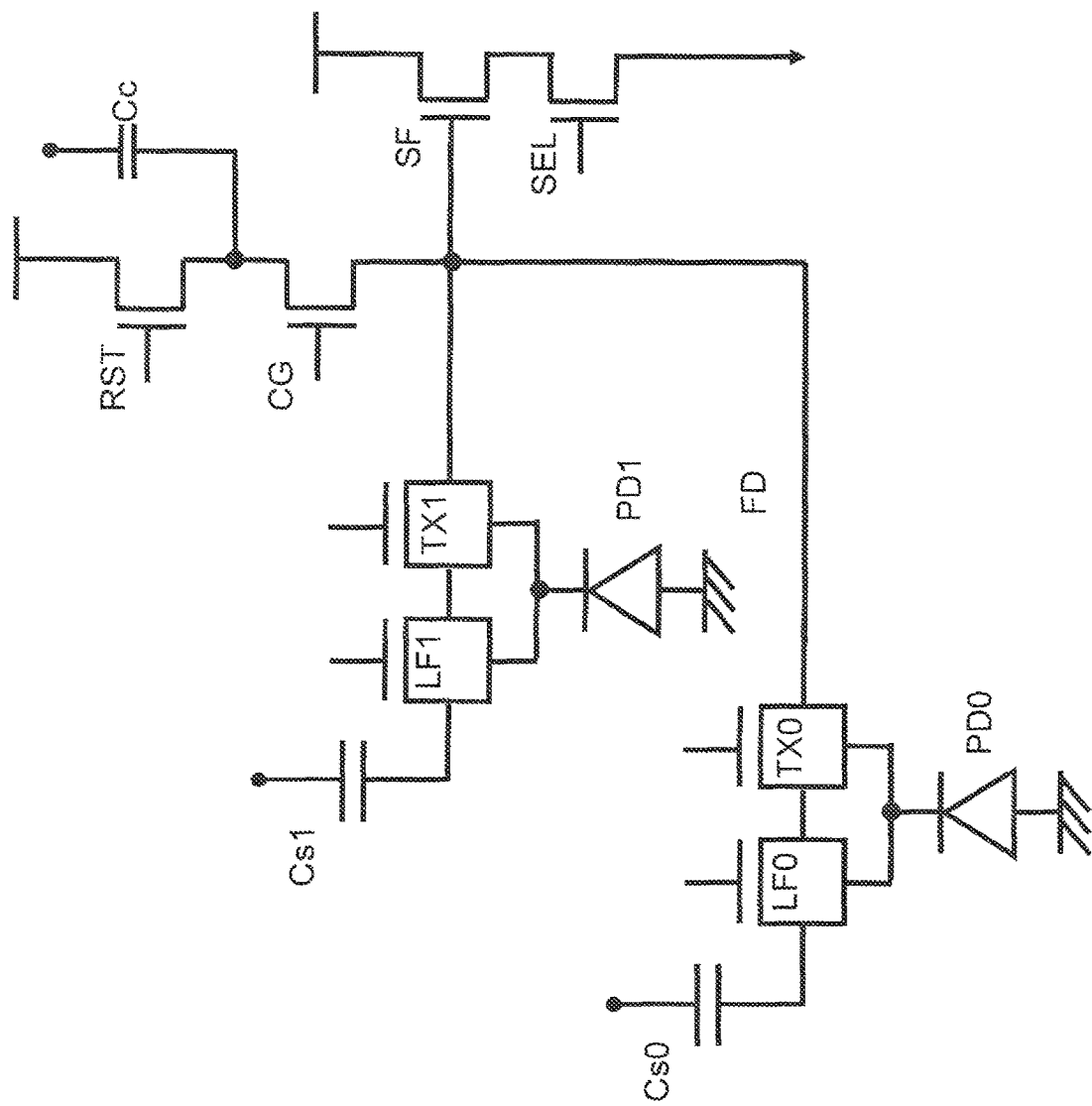
FIG. 9 is a circuit diagram of an example of a configuration including a conversion efficiency switching mechanism.

FIG. 9 shows a configuration which can switch the conversion efficiency of signal charge. A gain control switch transistor CG is disposed between the reset transistor RST and the floating diffusion FD (the gate of the source follower transistor SF). One end of a capacitor Cc is connected between the gain control switch transistor CG and the reset transistor RST, and the other end of the capacitor Cc is connected to a power source. The capacity of the floating diffusion FD can be switched by turning ON and OFF the gain control switch transistor CG. When the gain control switch transistor CG is turned OFF, a higher conversion efficiency with a lower capacity can be obtained, whereas when turned ON, a higher capacity with a lower conversion efficiency can be obtained. In general, it is known that while the LOFIC is suitable to obtain high luminance signals, the LOFIC causes a large noise for low luminance signals. When the output range of PD signals from the photodiode PD is too narrow, signal-to-noise ratio in the region where the PD signals are converted to the LOFIC signals is known to be lowered. Switching of conversion efficiency of the PD signals is known to be advantageous to ensure a sufficient PD output range while lowering the low-luminance noise, and effective, in combination with the LOFIC, to maintain image quality in the signal conversion range.

This conversion efficiency switch configuration is applicable to the pixel configuration of the present disclosure. This application enables ultra-compact pixels of the configuration according to the present disclosure to obtain wide dynamic range images while maintaining image quality.

[Image Sensor]

Figure 10:
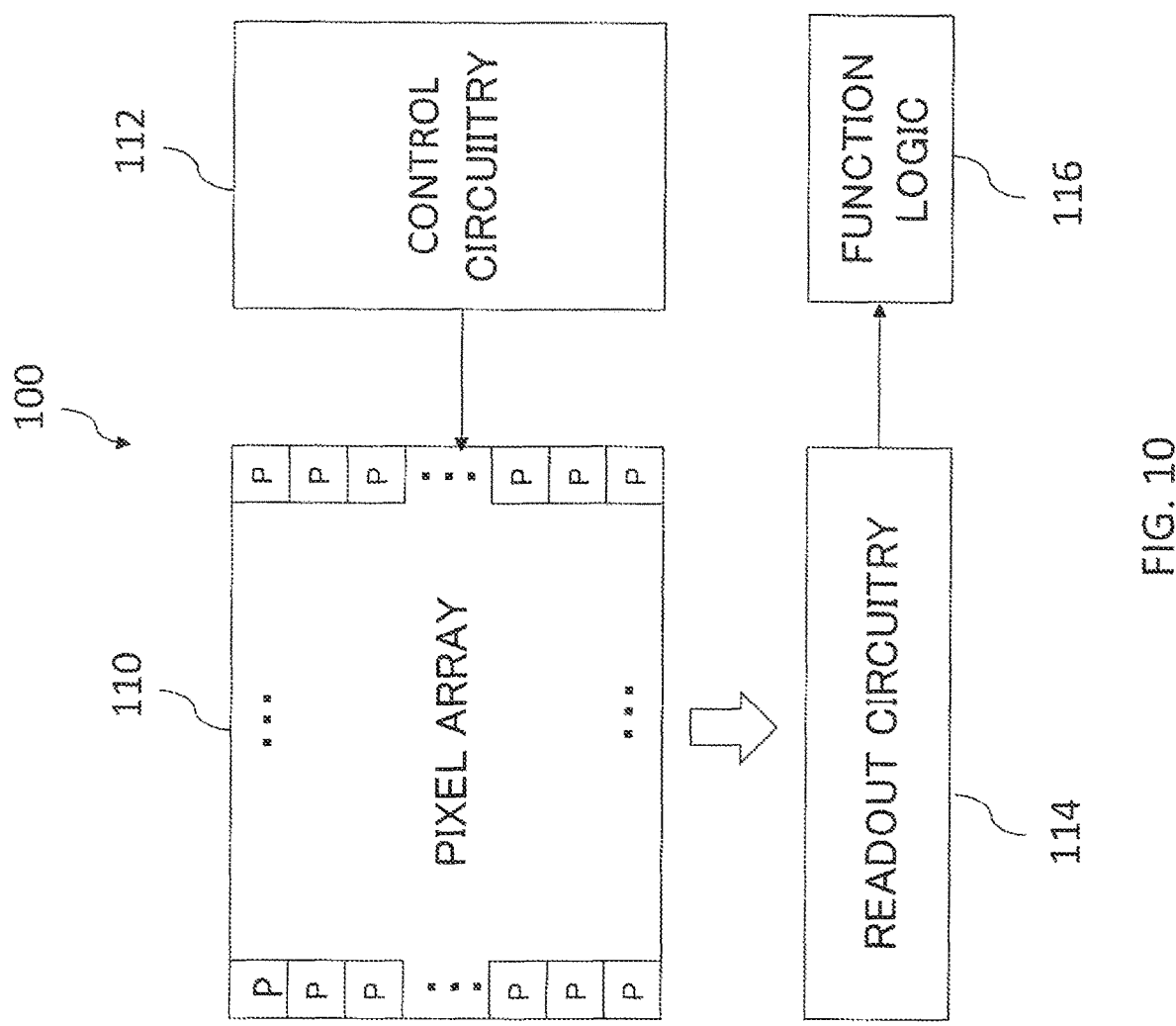
FIG. 10 is a block diagram showing a structure of an image sensor according to an embodiment of the present disclosure.

FIG. 10 is a block diagram showing a structure of an image sensor according to an embodiment of the present disclosure. An image sensor 100 of this example configuration comprises a pixel array 110, a readout circuitry 114, and a function logic 116.

The pixel array 110 is a two-dimensional array in which pixels P are arranged in rows and columns. Each pixel P may have a color filter on a light incidence side, and light of a particular color which has passed through the color filter is incident on the pixel P.

A control circuitry 112 controls operations of the pixel array 110. For example, the control circuitry 112 controls an exposure period of each pixel P, an output of the image signal of each pixel P, or the like.

The readout circuitry 114 individually reads out the image signal of each pixel P, analog-to-digital converter (ADC) converts the read signal to acquire digital data, and supplies the digital data to the function logic 116.

The function logic 116 applies processes on the data from each pixel P, to acquire the image data, and outputs the data. The image data is supplied to electronic devices such as display, storage device or something. The function logic 116 may be partially located outside the sensor chip, for example, it includes the processing by Application Processing Unit (APU).

Application Examples

The image sensor elements according to embodiments of the present disclosure can be applied to various types of image sensors, specifically, not only single exposure HDR systems, but also multiple exposure system including multiple pixels of different exposure times. The image sensor elements can also be used not only for a single-size pixel HDR sensor but also for a multi-size pixel sensor in which pixels of different sizes are combined to obtain a higher dynamic range. The image sensor elements can further be used in combination with a voltage-domain global shutter sensor, including a chip-stacked sensor.

In the present specification, signal charge is assumed to be electrons. However, signal charge may be holes. Even in this case, the above description can still be applied by exchanging the semiconductor types N and P, and the source and the drain.

The invention claimed is:

1. An image sensor element comprising:
   a transfer transistor that outputs a readout signal from a first end;
   a LOFIC select transistor comprising a first end connected to a second end of the transfer transistor, and a second end connected to a capacitor;
   a photodiode connected in common to a third end of the transfer transistor and a third end of the LOFIC select transistor; and
   a first overflow path formed between the photodiode and the capacitor,
   wherein each of the transfer transistor and the LOFIC select transistor is configured with a vertical gate transistor that comprises:
   a gate that extends vertically;
   a first end and a second end disposed around the gate in a horizontal periphery; and
   a third end disposed under the gate,
   wherein connections between the first end, the second end, and the third end are turned ON and OFF by controlling a voltage supplied to the gate, when positive voltage is applied to the gate, channels are formed between the first end, the second end, and the third end, around the gate in vertical and horizontal directions, making conductive paths between the first end, the second end, and the third end.

2. The image sensor element according to claim 1, wherein
   the transfer transistor and the LOFIC select transistor are disposed next to each other in a well, and
   the photodiode is disposed under the well.

3. The image sensor element according to claim 2, wherein
   the first end of the transfer transistor is connected to a floating diffusion that electrically floats, and the floating diffusion is connected to a gate of an output transistor.

4. The image sensor element according to claim 3, wherein during an exposure period in which the photodiode generates charges due to exposure, there is a potential gradient to channel regions of the LOFIC select transistor and the transfer transistor in order to transfer charges from the second end of the LOFIC select transistor toward the first end of the transfer transistor.

5. The image sensor element according to claim 4, wherein
   a path disposed between the second end of the LOFIC select transistor and the first end of the transfer transistor functions as a second overflow path.

6. An image sensor comprising a plurality of the image sensor elements arranged in a row direction and a column direction,
   each of the image sensor element comprising:
   a transfer transistor that outputs a readout signal from a first end;
   a LOFIC select transistor comprising a first end connected to a second end of the transfer transistor, and a second end connected to a capacitor;
   a photodiode connected in common to a third end of the transfer transistor and a third end of the LOFIC select transistor: and
   a first overflow path formed between the photodiode and the capacitor,
   wherein each of the transfer transistor and the LOFIC select transistor is configured with a vertical gatee transistor that comprises:
   a gate that extends vertically;
   a first end and a second end disposed around the gate in a horizontal periphery; and
   a third end disposed under the gate,
   wherein connections between the first end, the second end, and the third end are turned ON and OFF by controlling a voltage supplied to the gate, when positive voltage is applied to the gate, channels are formed between the first end, the second end, and the third end, around the gate in vertical and horizontal directions, making conductive paths between the first end, the second end, and the third end.

7. The image sensor according to claim 6, wherein
   the transfer transistor and the LOFIC select transistor are disposed next to each other in a well, and
   the photodiode is disposed under the well.

8. The image sensor according to claim 7, wherein
   the first end of the transfer transistor is connected to a floating diffusion that electrically floats, and the floating diffusion is connected to a gate of an output transistor.

9. The image sensor element according to claim 8, wherein
   during an exposure period in which the photodiode generates charges due to exposure, there is a potential gradient to channel regions of the LOFIC select transistor and the transfer transistor in order to transfer charges from the second end of the LOFIC select transistor toward the first end of the transfer transistor.

10. The image sensor according to claim 9 wherein
    a path disposed between the second end of the LOFIC select transistor and the first end of the transfer transistor functions as a second overflow path.

* * * * *